US012787405B2

(12) United States Patent
Cucci et al.

(10) Patent No.: US 12,787,405 B2
(45) Date of Patent: Nov. 3, 2026

(54) HIGH ELECTRON MOBILITY TRANSISTOR

(71) Applicant: GlobalFoundries U.S. Inc., Malta, NY (US)

(72) Inventors: Brett T. Cucci, Colchester, VT (US); Jacob M. DeAngelis, Burlington, VT (US); Spencer H. Porter, Colchester, VT (US); Trevor S. Wills, South Burlington, VT (US); Mark D. Levy, Williston, VT (US)

(73) Assignee: GLOBALFOUNDRIES U.S. Inc., Malta, NY (US)

(*) Notice: Subject to any disclaimer, the term of this patent is extended or adjusted under 35 U.S.C. 154(b) by 331 days.

(21) Appl. No.: 18/378,312

(22) Filed: Oct. 10, 2023

(65) Prior Publication Data

US 2025/0120156 A1 Apr. 10, 2025

(51) Int. Cl.

| | |
|---|---|
| ***H10D 64/00*** | (2025.01) |
| ***H10D 30/01*** | (2025.01) |
| ***H10D 30/47*** | (2025.01) |
| ***H10D 62/85*** | (2025.01) |
| ***H10D 64/01*** | (2025.01) |

(52) U.S. Cl.

CPC ......... *H10D 64/111* (2025.01); *H10D 30/015* (2025.01); *H10D 30/475* (2025.01); *H10D 62/8503* (2025.01); *H10D 64/01* (2025.01); *H10D 64/118* (2025.01)

(58) Field of Classification Search

CPC ............. H10D 64/111; H10D 62/8503; H10D 64/118; H10D 64/01; H10D 30/015; H10D 30/475

See application file for complete search history.

(56) References Cited

U.S. PATENT DOCUMENTS

| | | | | |
|---|---|---|---|---|
| 5,972,763 | A | 10/1999 | Chou et al. | |
| 7,550,783 | B2 | 6/2009 | Wu et al. | |
| 7,812,369 | B2 | 10/2010 | Chini et al. | |
| 8,283,699 | B2 | 10/2012 | Wu | |
| 10,153,273 | B1 | 12/2018 | Tsai et al. | |
| 2017/0133496 | A1* | 5/2017 | Tsai | H10D 64/111 |
| 2020/0373420 | A1* | 11/2020 | Chou | H10D 62/8503 |
| 2020/0388694 | A1 | 12/2020 | Cheng et al. | |

(Continued)

FOREIGN PATENT DOCUMENTS

| | | | |
|---|---|---|---|
| CN | 111916449 | A | 11/2020 |
| CN | 114497198 | A | 5/2022 |
| JP | 2015050335 | A | 3/2015 |

OTHER PUBLICATIONS

The Extended European Search Report and Opinion dated Aug. 13, 2024 in EP Application No. 24166603.1-1211, 10 pages.

(Continued)

*Primary Examiner* — Richard A Booth

(74) *Attorney, Agent, or Firm* — Francois Pagette; Andrew M. Calderon; Calderon Safran & Wright P.C.

(57) ABSTRACT

The present disclosure relates to semiconductor structures and, more particularly, to high electron mobility transistors and methods of manufacture. The structure includes: a semiconductor substrate; a gate structure on the semiconductor substrate; a gate metal connecting to the gate structure; and a field plate connected to a source region of the gate structure. The gate metal and the field plate include a same material.

18 Claims, 5 Drawing Sheets

(56) References Cited

U.S. PATENT DOCUMENTS

| | | | | |
|---|---|---|---|---|
| 2022/0130965 | A1 | 4/2022 | Bothe et al. | |
| 2023/0037420 | A1 | 2/2023 | Kantarovsky et al. | |
| 2023/0253471 | A1* | 8/2023 | Tachi .................. | H10D 30/475<br>257/76 |

OTHER PUBLICATIONS

International Office Action dated Nov. 11, 2025 in EP Application No. 24 166 603.1-1211, 10 Pages.
Office Action dated Jun. 11, 2026 in EP Application No. 24 166 603.1-1211, 7 Pages.

* cited by examiner

HIGH ELECTRON MOBILITY TRANSISTOR

This invention was made with government support under Contract #HQ0727790700 awarded by Defense Microelectronics Activity (DMEA). The government has certain rights in the invention.

BACKGROUND

The present disclosure relates to semiconductor structures and, more particularly, to high electron mobility transistors and methods of manufacture.

A high-electron-mobility transistor (HEMT) is a field-effect transistor incorporating a junction between two materials with different band gaps (i.e. a heterojunction) as the channel, instead of a doped region (as is generally the case for a MOSFET). Commonly used material families are GaN or GaAs, although other materials can be used, dependent on the application of the device.

Due to the higher critical field and switching figures of merit of the GaN materials system, GaN HEMT devices typically have a higher electric-field strength than silicon MOSFETS, providing substantial performance improvements in, for example, on-resistance and breakdown voltage, while offering fast switching speed, amongst other important parameters. Since these properties result in fundamentally higher system efficiency, HEMTs may be used in diverse power management applications such as AC-DC and DC-DC conversion in the consumer or automotive space. In RF applications, they may be used in high frequency power amplifiers, low noise amplifiers or switches in such applications as cell phones, satellite or receivers or radar equipment.

SUMMARY

In an aspect of the disclosure, a structure comprises: a semiconductor substrate; a gate structure on the semiconductor substrate; a gate metal connecting to the gate structure; and a field plate connected to a source region of the gate structure, wherein the gate metal and the field plate comprise a same material.

In an aspect of the disclosure, a structure comprises: a semiconductor substrate; a gate structure on the semiconductor substrate; a gate metal connecting to the gate structure; a field plate adjacent to and coplanar with the gate metal.

In an aspect of the disclosure, a method comprises: forming a gate structure on a semiconductor substrate; forming a gate metal connecting to the gate structure; and forming a field plate connected to a source region of the gate structure, wherein the gate metal and the field plate comprise a same material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to high electron mobility transistors and methods of manufacture. More specifically, the present disclosure relates to a high electron mobility transistor (HEMT) or metal-insulator-semiconductor high-electron-mobility transistor (MISHEMT) comprising an airgap between a gate metal and a field plate metal. In embodiments, the HEMT may be an AlGaN/GaN HEMT with a same material for both the gate metal and the field plate metal. Advantageously, the HEMT has a reduced gate-to-source capacitance and does not require an etch to punch through a separate field plate metal.

In more specific embodiments, a HEMT may include a field plate and a gate metal formed from a same material during a same deposition process. An airgap (e.g., cavity) may be formed between the field plate and the gate metal. The field plate and the gate metal have a same thickness/height and material composition (e.g., TiN, Al, etc.). An interlevel dielectric material may be arranged over the field plate, the gate metal, and the airgap. The interlevel dielectric material may surround or encapsulate the airgap. Also, in embodiments, the airgap may be self-aligned to the field plate and the gate metal.

The device of the present disclosure can be manufactured in a number of ways using a number of different tools. In general, though, the methodologies and tools are used to form structures with dimensions in the micrometer and nanometer scale. The methodologies, i.e., technologies, employed to manufacture the device of the present disclosure have been adopted from integrated circuit (IC) technology. For example, the structures are built on wafers and are realized in films of material patterned by photolithographic processes on the top of a wafer. In particular, the fabrication of the device uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
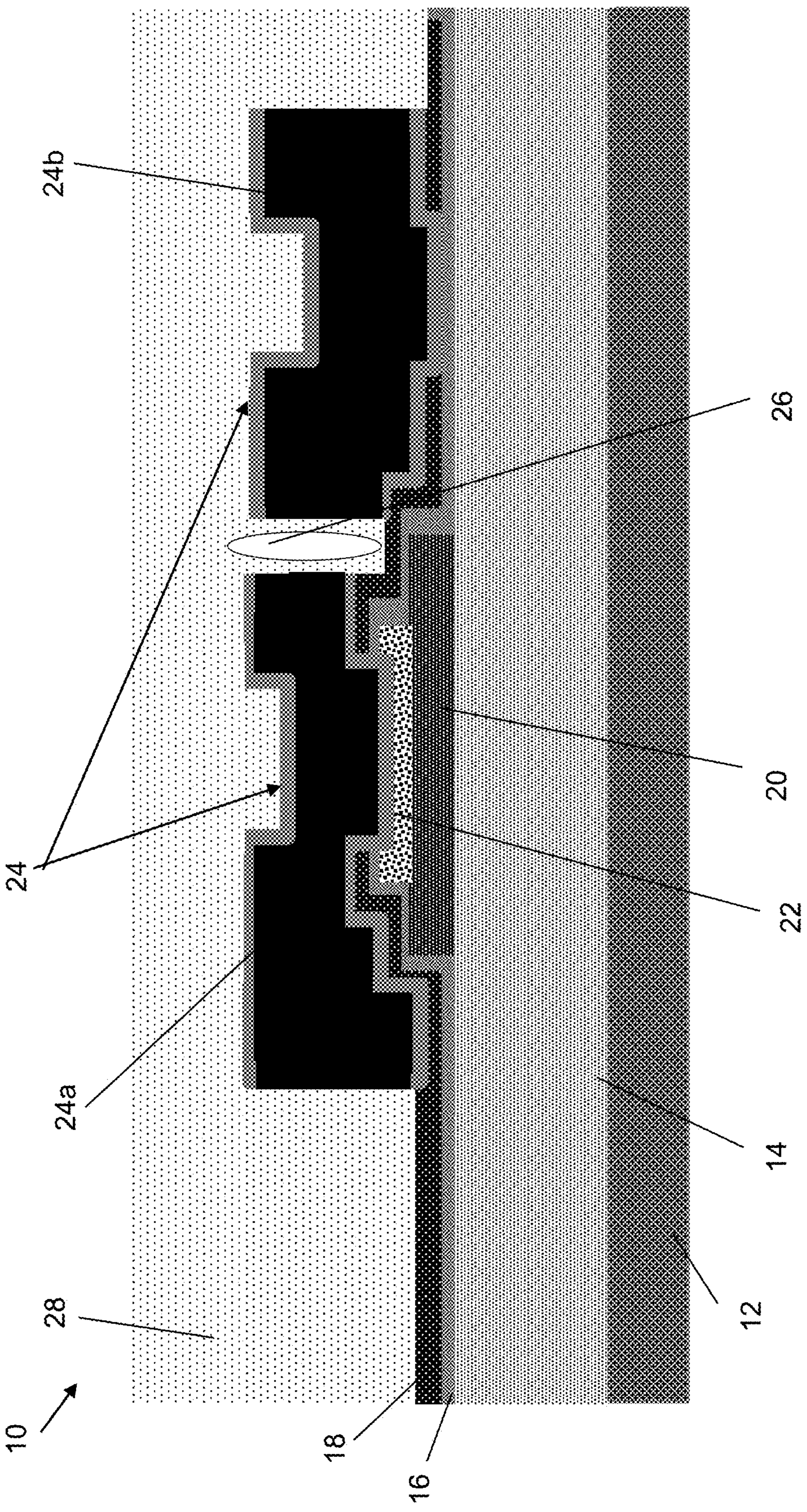
FIG. 1 shows a device in accordance with aspects of the present disclosure.

FIG. 1 shows a device in accordance with aspects of the present disclosure. In embodiments, the device 10 includes a semiconductor substrate 12 with a buffer layer 14 over the semiconductor substrate 12 and barrier layers 16, 18 over the buffer layer 14. A gate structure 20 may be formed on the buffer layer 14, with the barrier layers 16, 18 partially over the gate structure 20.

In embodiments, the semiconductor substrate 12 may a bulk semiconductor material or a semiconductor-on-insulator (SOI) technology. The semiconductor substrate may be, e.g., Si, with a single crystalline orientation. For example, in preferred embodiments, the semiconductor substrate 12 comprises p-type Si material with a suitable crystal orientation, e.g., (111). In alternative embodiments, the semiconductor substrate 12 may be any suitable material including, but not limited to, SiC, SiGe, SiGeC, GaAs, InAs, InP, Sapphire and other III/V or II/VI compound semiconductors.

The buffer layer 14 may be any semiconductor material that acts as a buffer material in a HEMT as is known in the art. For example, the buffer layer 24 may comprise a GaN stack, e.g., AlGaN/GaN. In more specific embodiments and as an illustrative non-limiting example, the GaN stack may be, for example, a super lattice of graded AlGaN/GaN (to reduce stress mismatch between the semiconductor substrate 12), followed by a GaN layer and an AlGaN layer.

The barrier layer 16 may be an insulator material. For example, the insulator layer may be, e.g., $Al_yO_x$. The barrier layer 18 may be SiN, oxide or other dielectric material. In embodiments, the barrier layers 16, 18 may be formed partially over gate structure 20, with the gate structure 20 comprising p-doped GaN. A gate electrode 22 may be provided over gate structure 20. In embodiments, the gate electrode 22 may be TiN as an example.

FIG. 1 further shows a common metal material 24 used as both a gate metal 24*a* and a field plate 24*b*. In embodiments, the common metal material 24 may be TiN/Al/TiN or combinations of other metals or alloys formed or deposited in a same deposition process thereby eliminating an additional masking processes. By using a single deposition process, the common metal material 24 will have a same height or thickness for both the gate metal 24*a* and the field plate 24*b*; that is, the gate metal 24*a* and the field plate 24*b* will have a same thickness. The gate metal 24*a* contacts the gate electrode 22 of the gate structure 20 and the field plate 24*b* may be a source-connected field plate.

Still referring to FIG. 1, an airgap 26 may be provided between the gate metal 24*a* and the field plate 24*b*. In embodiments, the airgap 26 is self-aligned to the gate metal 24*a* and the field plate 24*b*. For example, the airgap is at a same level of the structure as the gate metal 24*a* and the field plate 24*b*. This self-alignment results from a pinch-off process during a deposition of interlevel dielectric material 28 over the gate metal 24*a* and the field plate 24*b*. In embodiments, the airgap 26 may be surrounded (e.g., encapsulated) by the interlevel dielectric material 28, and may electrically isolate the gate metal 24*a* from the field plate 24*b*.

Also, by using the combination of the gate metal 24*a* and the field plate 24*b* of a same metal material and the airgap 26 between the gate metal 24*a* and the field plate 24*b*, it is now possible to have the gate metal 24*a* and the field plate 24*b* very close to one another which results in reduced gate-to-source capacitance. This would not be possible with the use of a separate metal deposition processes and/or materials for the gate metal and the field plate due to processing parameters, e.g., minimum critical dimension in the deposition processes and/or overlay of two separate masks. Although not shown, it should be understood by those of skill in the art that contacts may be provided to the gate metal 24*a* and the field plate 24*b* as is known in the art.

Figure 2A:
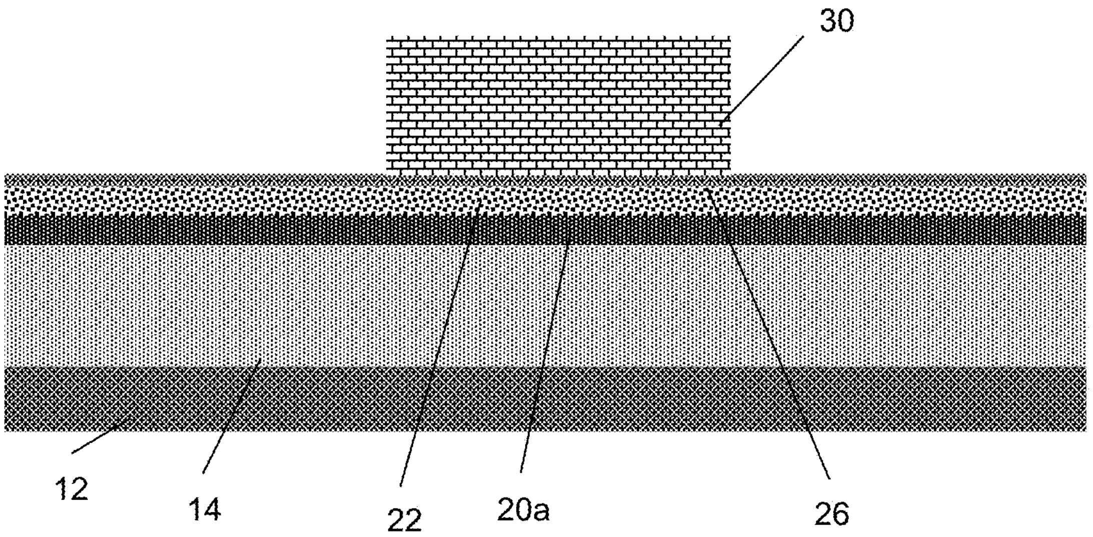
FIGS. 2A-2H show fabrication processes for manufacturing the device of FIG. 1 in accordance with aspects of the present disclosure.

FIGS. 2A-2H show fabrication processes for manufacturing the device of FIG. 1 in accordance with aspects of the present disclosure. For example, FIG. 2A shows the semiconductor substrate 12 with the buffer layer 14 over the semiconductor substrate 12 and a gate material 20*a* may be formed on the buffer layer 14. The buffer layer 14 may be formed by an epitaxial growth process as is known in the art such that no further explanation is required herein for a complete understanding of the present disclosure. A gate electrode 22 is formed over the gate material 20*a* and a masking material 26 is formed over gate electrode 22. The masking material 26 may be SiN material, deposited by a conventional deposition method, e.g., chemical vapor deposition (CVD) process. A hardmask 30 may be formed and patterned over the masking material 26 to define the gate structure.

Figure 2B:
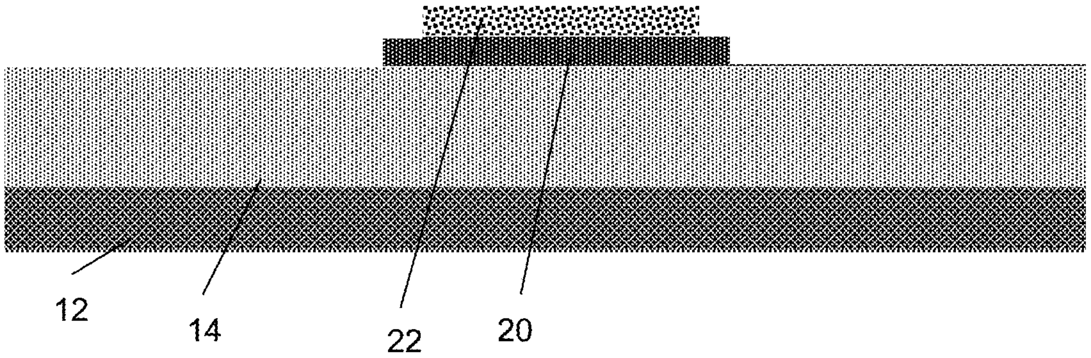

In FIG. 2B, the gate structure 20 is patterned using conventional etching processes. For example, the etching processes may be a reactive etching (RIE) process. The masking material may be removed from a top surface of the gate structure 20, e.g., gate electrode 22. A pull back process, e.g., wet etch process, may be used to pull back the gate electrode 22, e.g., TiN material.

Figure 2C:
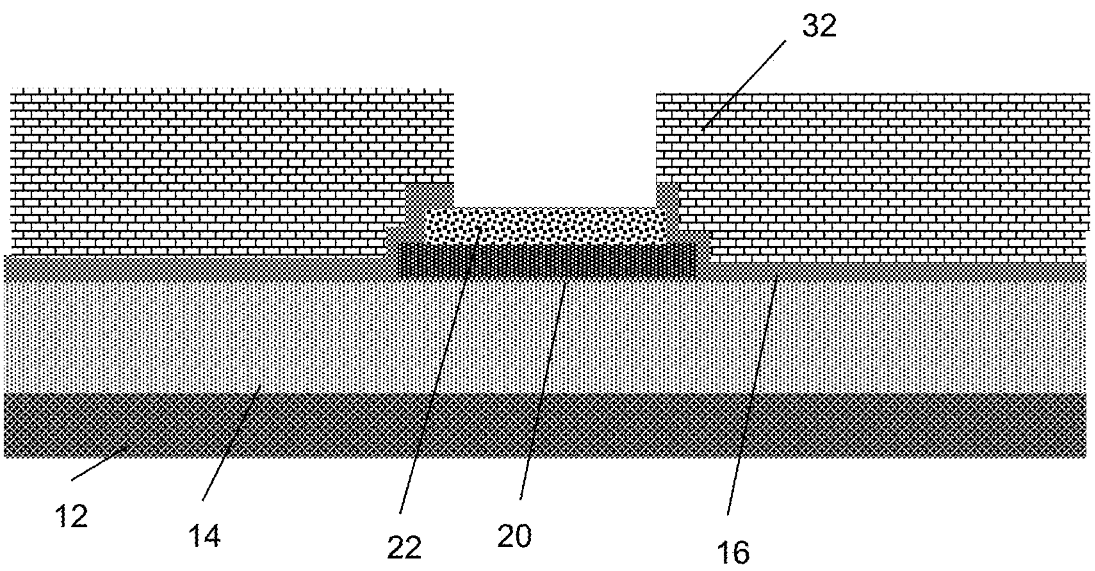

In FIG. 2C, the barrier layer 16, e.g., insulator material, may be deposited over the structure. The barrier material 16 may be deposited by a conventional deposition process, e.g., CVD. A resist 32 is formed over the barrier layer 16 and is patterned to form an opening over and aligned with the gate structure 20. The exposed insulator material 16 may be removed, e.g., etched, to expose the gate electrode 22. The resist 32 may be removed by a conventional oxygen ashing process or other stripants as known in the art.

Figure 2D:
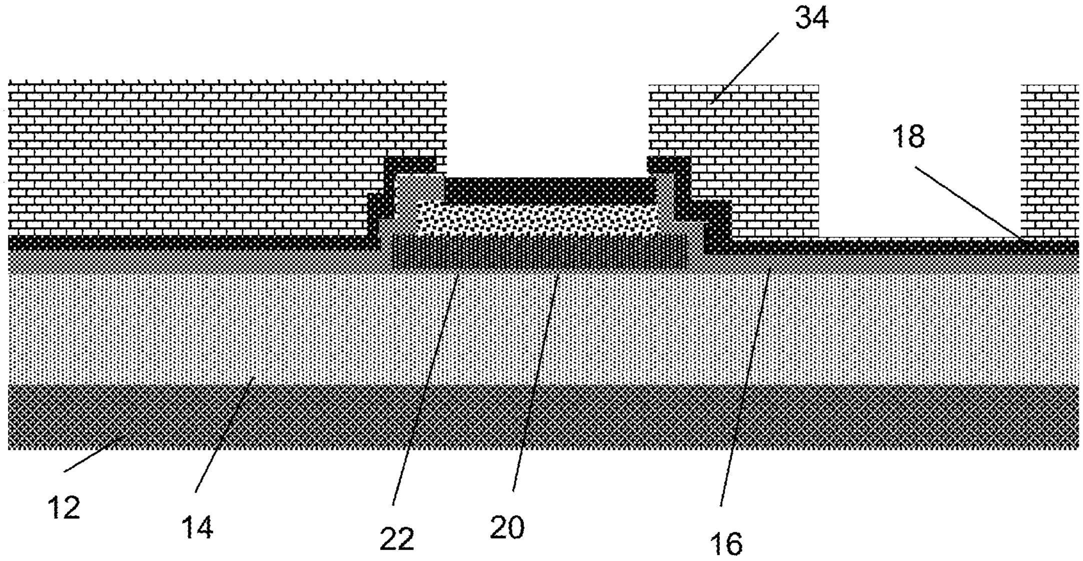

In FIG. 2D, the barrier layer 18 is formed over the barrier layer 16 and the expose gate electrode 22. In embodiments, the barrier layer 18 may be an insulator material such as, for example, SiN, deposited by a conventional deposition method, e.g., CVD. A resist 34 may be formed over the barrier layer 18. The resist 34 is patterned, e.g., through a conventional lithography process, to expose the barrier layer 18 over the gate structure 20 and a source region of the device, for example.

Figure 2E:
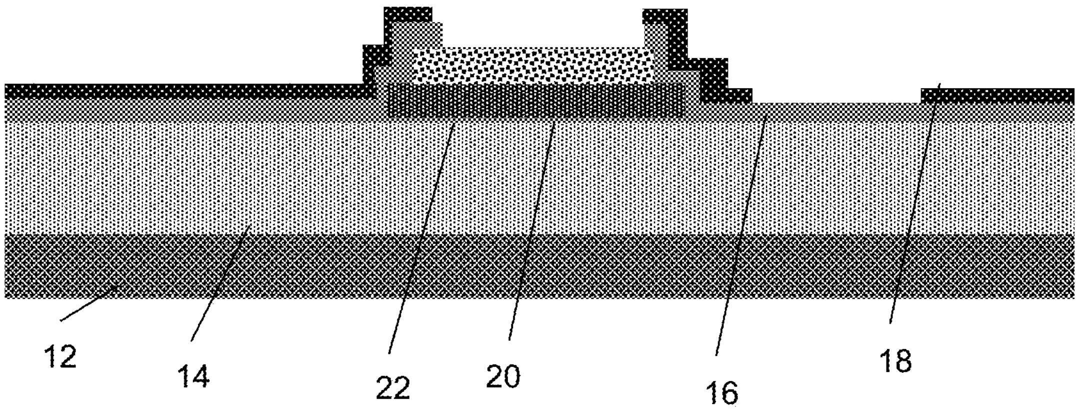

In FIG. 2E, the exposed barrier layer 18 over the gate structure 20 and the source region of the device is removed through a conventional etching process, e.g., RIE, with a chemistry selective to the barrier layer. In embodiments, the etching process will expose the gate electrode 22 of the gate structure 20 and the underlying barrier layer 16 in the source region, for example. The resist may be removed by a conventional oxygen ashing process or other stripants as known in the art.

Figure 2F:
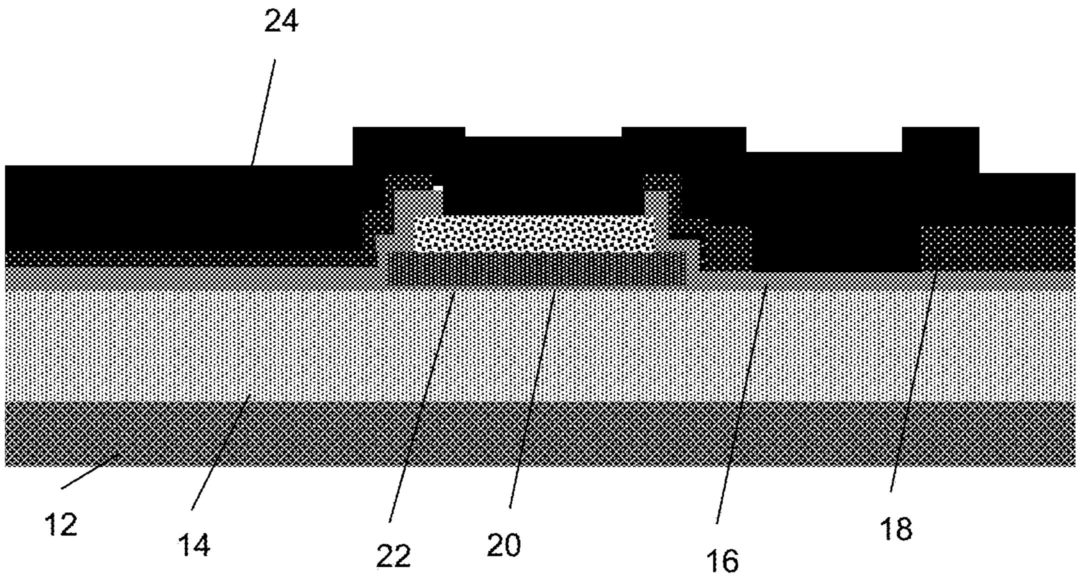

In FIG. 2F, a blanket deposition of metal material 24 may be provided over the entire structure. In embodiments, the metal material 24 may be deposited over the gate electrode 22 of the gate structure 20 and the underlying barrier layer 16 in the source region, for example. In this way, the metal material 24 may be in direct contact with the gate electrode 22 of the gate structure 20 and the underlying barrier layer 16 in the source region, for example. The metal material 24 will have a same thickness over the structure. The metal material 24 may be deposited by a conventional deposition process, e.g., PVD.

Figure 2G:
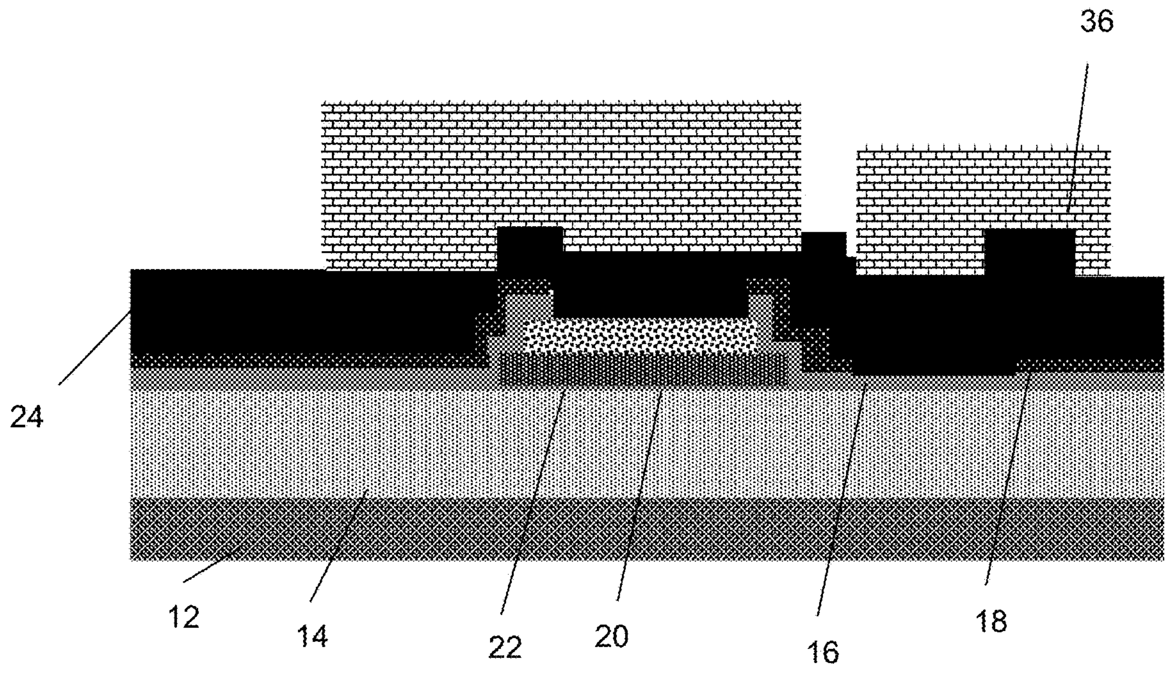

In FIG. 2G, a resist 36 is formed and patterned over the metal material 24. In embodiments, the patterning of the resist will define the gate metal 24*a* and the field plate 24*b*, as shown in FIG. 2H.

Figure 2H:
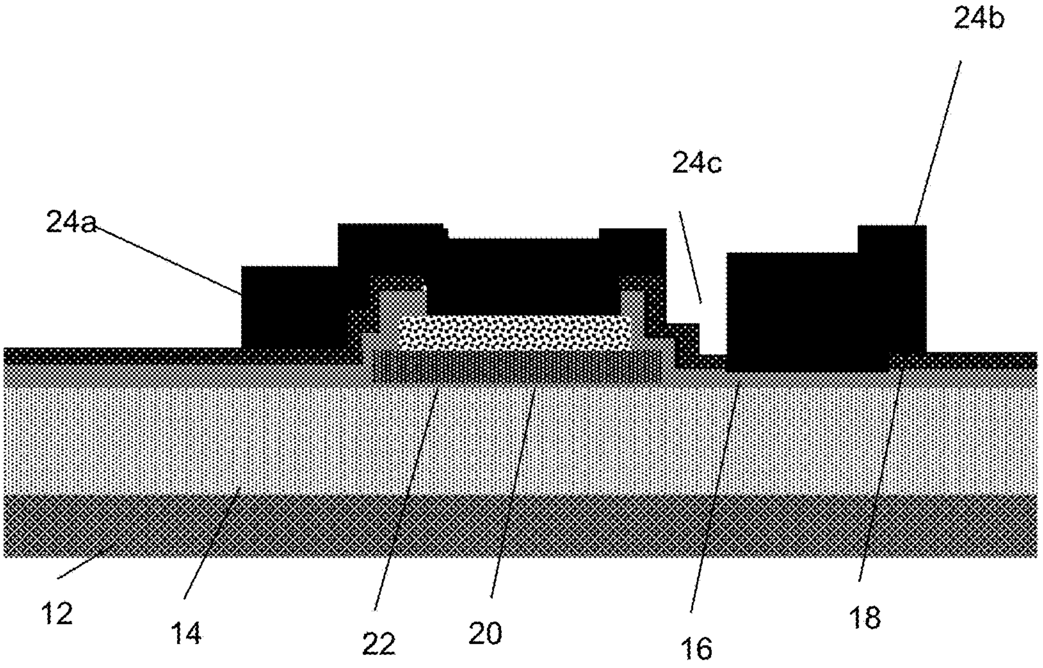

In FIG. 2H, following the patterning of the resist 36, the metal material 24 will undergo an etching process, e.g., RIE, to form the gate metal 24*a* and the field plate 24*b*, with an opening 24*c* therebetween. In embodiments, the opening 24*c* will electrically isolate the gate metal 24*a* from the field plate 24*b*. And by using a single deposition process of the metal material 24 and a subsequent etching process, it is now possible to eliminate alignment issues with the gate metal 24*a* and the field plate 24*b*. The gate metal 24*a* and the field plate 24*b* will also have the same thickness and be of the same material.

Referring back to FIG. 1, an interlevel dielectric material 28 may be deposited over the patterned metal material 24, e.g., gate metal 24*a* and the field plate 24*b*. The interlevel dielectric material 28 may be deposited by a conventional deposition process, e.g., CVD. During the deposition process, the airgap 26 will form within the opening 24*c* due to a pinch-off phenomenon as is known in the art. The interlevel dielectric material 28 will surround or encapsulate the airgap 26, which will also isolate the gate metal 24*a* and the field plate 24*b*.

The HEMT can be utilized as a single device in discrete applications, may be combined in a single package with several other devices of the same or varying types via co-packaging or multi-chip 3D integration techniques, or may be combined with several other devices in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things. Moreover, GaN devices are increasingly being employed in SoC designs where multiple GaN HEMTs are formed on a single substrate.

The method(s) as described above is used in the fabrication of discrete device or integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes discrete or integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a semiconductor substrate;
a gate structure on the semiconductor substrate;
a gate metal connecting to the gate structure;
a field plate connected to a source region of the gate structure, the field plate being laterally spaced from the gate metal by an airgap; and
an interlevel dielectric material over the gate metal and the field plate and encapsulating the airgap,
wherein the gate metal and the field plate comprise a same material layer and are coplanar with one another.

2. The structure of claim 1, wherein the same material comprises TiN.

3. The structure of claim 2, wherein the same material comprises TiN/Al/TiN.

4. The structure of claim 1, wherein the gate structure comprises p-doped GaN.

5. The structure of claim 4, wherein the semiconductor substrate comprises a GaN stack.

6. The structure of claim 1, wherein the field plate and the gate metal comprise a same thickness.

7. The structure of claim 1, wherein the airgap is self-aligned to the field plate and the gate metal.

8. A structure comprising:
a semiconductor substrate;
a gate structure on the semiconductor substrate;
a gate metal connecting to the gate structure;
a field plate adjacent to and coplanar with the gate metal, the field plate being electrically connected to a source region of the gate structure and physically separated from the gate metal by an airgap; and
an interlevel dielectric material surrounding the airgap,
wherein the gate metal and the field plate are formed from a same deposited metal layer.

9. The structure of claim 8, wherein the gate structure comprises p-doped GaN.

10. The structure of claim 8, wherein the field plate and the gate metal comprise a same thickness.

11. The structure of claim 8, wherein the airgap is self-aligned to the field plate and the gate metal.

12. A method comprising:
forming a gate structure on a semiconductor substrate;
forming a gate metal connecting to the gate structure;
forming a field plate connected to a source region of the gate structure from a same deposited material layer as the gate metal and coplanar with the gate metal;
forming an airgap between the gate metal and the field plate; and
forming an interlevel dielectric material over the gate metal and the field plate such that the interlevel dielectric material encapsulates the airgap, and the field plate is laterally spaced from the gate metal by an airgap.

13. The structure of claim 1, wherein the interlevel dielectric material completely encapsulates the airgap.

14. The structure of claim 1, wherein the gate metal and the field plate have a same height.

15. The structure of claim 1, wherein the field plate is positioned on a source side of the gate structure.

16. The structure of claim 1, wherein the airgap extends continuously along a length of the gate metal.

17. The structure of claim 8, wherein the gate metal and the field plate are formed from a common conductive layer.

18. The structure of claim 8, wherein the field plate is electrically connected to a source contact region.

* * * * *